US010643707B2

(12) United States Patent
Rajamani et al.

(10) Patent No.: US 10,643,707 B2
(45) Date of Patent: May 5, 2020

(54) GROUP WRITE OPERATIONS FOR A DATA STORAGE DEVICE

(71) Applicant: WESTERN DIGITAL TECHNOLOGIES, INC., San Jose, CA (US)

(72) Inventors: Thibash Rajamani, Bangalore (IN); Ramesh Chander, Bangalore (IN); Manavalan Krishnan, Fremont, CA (US); Brian O'Krafka, Austin, TX (US); Nagi Reddy Chodem, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 108 days.

(21) Appl. No.: 15/659,208

(22) Filed: Jul. 25, 2017

(65) Prior Publication Data
US 2019/0035473 A1 Jan. 31, 2019

(51) Int. Cl.
| G11C 16/10 | (2006.01) |
| G06F 12/0817 | (2016.01) |
| G06F 3/06 | (2006.01) |
| G06F 12/02 | (2006.01) |
| G06F 12/06 | (2006.01) |

(52) U.S. Cl.
CPC .......... G11C 16/105 (2013.01); G06F 3/061 (2013.01); G06F 3/0659 (2013.01); G06F 3/0679 (2013.01); G06F 12/0246 (2013.01); G06F 12/0817 (2013.01); G06F 12/0623 (2013.01); G06F 2212/1024 (2013.01); G06F 2212/7201 (2013.01); G06F 2212/7203 (2013.01)

(58) Field of Classification Search
CPC ............ G06F 12/0246; G06F 12/0817; G06F 12/0623; G06F 3/0679; G06F 3/061; G06F 3/0659; G06F 2212/7203; G06F 2212/1024; G06F 2212/7201; G11C 16/105
USPC ........................................ 711/103
See application file for complete search history.

(56) References Cited

U.S. PATENT DOCUMENTS

| 7,216,199 | B2 * | 5/2007 | Mizuno ................. G06F 3/0605 711/113 |
| 7,464,229 | B1 * | 12/2008 | Jones ................... G11C 7/1075 711/154 |
| 8,112,574 | B2 | 2/2012 | Lee et al. |
| 9,122,588 | B1 * | 9/2015 | Mondal ............... G06F 12/0246 |
| 9,274,720 | B1 * | 3/2016 | Ori ......................... G06F 3/0653 |
| RE46,201 | E | 11/2016 | Selinger et al. |
| 9,703,498 | B1 * | 7/2017 | Armangau ............. G06F 3/065 |
| 9,720,596 | B1 * | 8/2017 | Bono .................... G06F 3/0608 |
| 10,049,055 | B2 * | 8/2018 | Mondal ............... G06F 12/0246 |
| 2006/0155946 | A1 * | 7/2006 | Ji .......................... G06F 3/0617 711/162 |
| 2007/0239944 | A1 * | 10/2007 | Rupanagunta ........ G06F 3/0613 711/147 |

(Continued)

*Primary Examiner* — Yaima Rigol
(74) *Attorney, Agent, or Firm* — Vierra Magen Marcus LLP

(57) ABSTRACT

An apparatus includes a non-volatile memory and a controller coupled to the non-volatile memory. The controller is configured to receive a command from a device to perform a write operation at the non-volatile memory. The command indicates a plurality of logical addresses, data associated with the plurality of logical addresses, and a number of write operations associated with the command.

20 Claims, 4 Drawing Sheets

(56) References Cited

U.S. PATENT DOCUMENTS

| | | | |
|---|---|---|---|
| 2007/0300009 A1* | 12/2007 | Rogers | G06F 3/0613 711/103 |
| 2008/0059751 A1* | 3/2008 | Nakamura | G06F 3/0608 711/170 |
| 2008/0082742 A1* | 4/2008 | Tashiro | G11B 20/10 711/112 |
| 2008/0209161 A1* | 8/2008 | Yun | G06F 12/0246 711/207 |
| 2009/0113119 A1 | 4/2009 | Oribe et al. | |
| 2009/0125681 A1* | 5/2009 | Makita | G11B 27/002 711/114 |
| 2009/0249022 A1* | 10/2009 | Rowe | G06F 3/0689 711/206 |
| 2010/0250891 A1* | 9/2010 | Shalev | G06F 3/061 711/171 |
| 2010/0332732 A1* | 12/2010 | Chiang | G06F 12/0246 711/103 |
| 2011/0138105 A1* | 6/2011 | Franceschini | G06F 12/0246 711/103 |
| 2012/0226827 A1* | 9/2012 | Raju | G06F 13/385 710/5 |
| 2012/0311180 A1* | 12/2012 | Barkey | G06F 13/385 709/238 |
| 2013/0173857 A1* | 7/2013 | Cheon | G06F 12/0246 711/103 |
| 2013/0346725 A1* | 12/2013 | Lomet | G06F 12/10 711/206 |
| 2014/0181464 A1* | 6/2014 | Forsyth | G06F 9/30018 711/214 |
| 2014/0201429 A1* | 7/2014 | Tal | G06F 12/0246 711/103 |
| 2014/0289484 A1* | 9/2014 | Chu | G06F 12/06 711/154 |
| 2016/0147671 A1 | 5/2016 | Vishne et al. | |
| 2016/0283116 A1* | 9/2016 | Ramalingam | G06F 12/0895 |
| 2017/0242785 A1* | 8/2017 | O'Krafka | G06F 12/0246 |
| 2017/0242790 A1* | 8/2017 | O'Krafka | G06F 3/0604 |
| 2018/0098359 A1* | 4/2018 | Patel | H04B 7/0617 |
| 2019/0018593 A1* | 1/2019 | Hutchison | G06F 3/065 |

* cited by examiner

GROUP WRITE OPERATIONS FOR A DATA STORAGE DEVICE

FIELD OF THE DISCLOSURE

This disclosure is generally related to electronic devices and more particularly to data storage devices used by electronic devices to store data.

BACKGROUND

Data storage devices enable users to store and retrieve data. Examples of data storage devices include volatile memory devices and non-volatile memory devices. A non-volatile memory may retain data after a power-down event.

A data storage device may receive requests for memory access from a device, such as write request from an accessing device. In some cases, multiple requests for memory access (e.g., read requests or write requests) may reduce performance at the data storage device, the accessing device, or both. For example, multiple concurrent requests for memory access to the data storage device may increase latency at the data storage device, may increase a number of program/erase cycles (PECs) at the data storage device, or both.

An accessing device (e.g., a host device) may use a write serialization (WS) technique that groups write requests into logical groups, such as by "grouping" multiple write requests into a larger set of serial write operations. In accordance with a WS technique, an accessing device may use a mapping table to indicate mapping of write requests to logical groups. Maintaining the mapping table uses resources of the accessing device. For example, the mapping table may occupy a relatively large amount of volatile memory of the accessing device and may be backed up to a non-volatile memory in case of a power-down event. As another example, certain garbage collection operations may be performed to delete or compact entries of the mapping table. Further, a WS technique may be infeasible in certain large scale implementations (e.g., where a size of the mapping table is larger than a storage capacity of the volatile memory).

DETAILED DESCRIPTION

Figure 1:
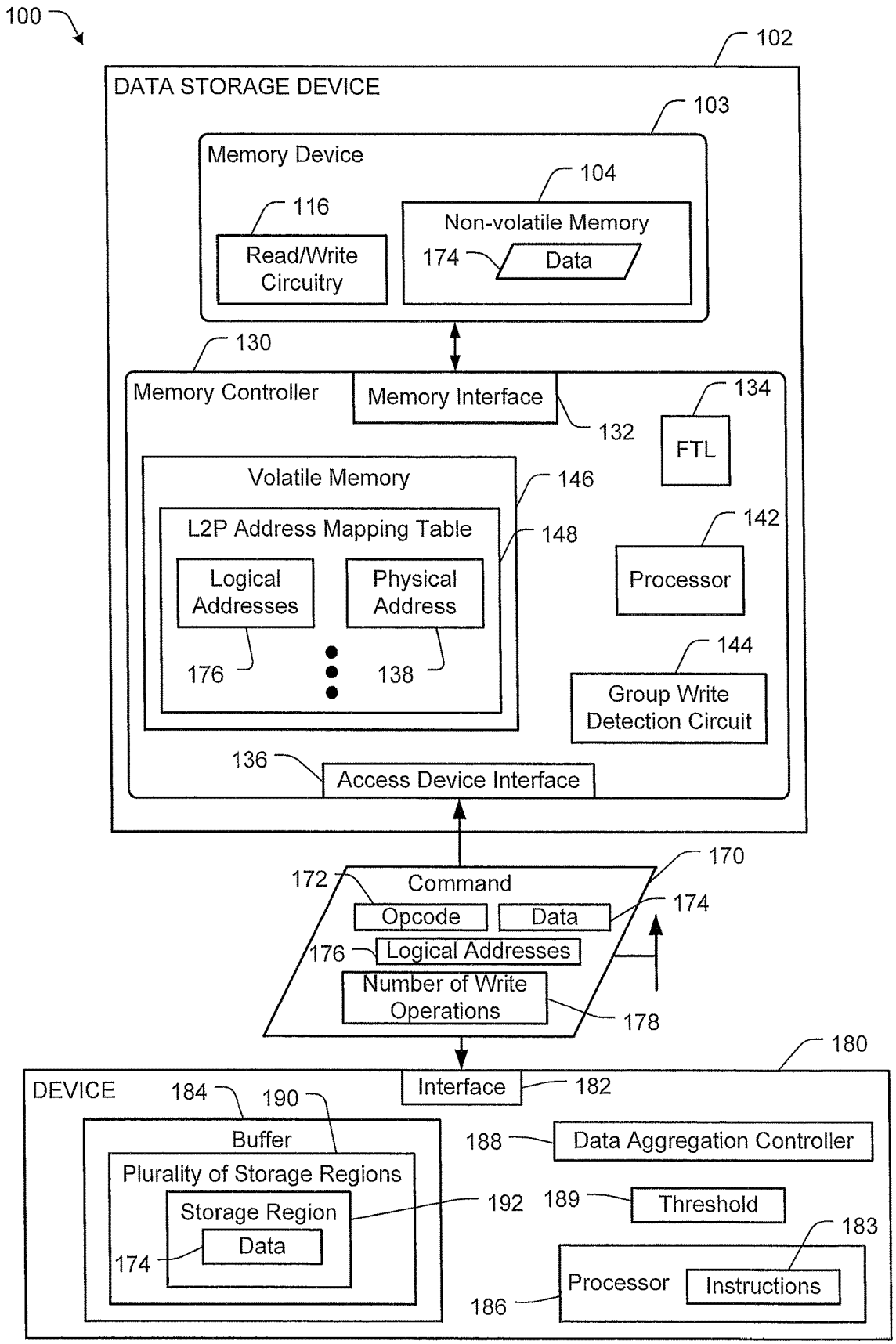
FIG. 1 is a block diagram of a particular illustrative example of a system including an accessing device and a data storage device configured to perform group write operations.

A data storage device in accordance with certain aspects of the disclosure may receive multiple write requests of a particular command (e.g., a write serialization (WS) group write command) from an accessing device. The command may indicate a plurality of logical addresses, a number of write operations associated with the command, and an opcode (e.g., a WS group write opcode) that indicates that the data is to be written as a group. To further illustrate, the accessing device may issue the WS group write command to the data storage device in response to determining that the multiple write requests belong to the same group of write requests (e.g., that addresses of the plurality of logical addresses are related to one another). Alternatively, if multiple write requests are unrelated, the accessing device may issue separate commands to the data storage device (e.g., using a "default" write command instead of a WS group write command).

By using the WS group write command, the accessing device may "bundle" multiple write commands to be executed by the data storage device as a single command. In a particular example, each of the individual write commands may be associated with a particular portion of a logical-to-physical (L2P) address mapping table of the data storage device, which may enable the accessing device to avoid maintaining a separate mapping table that indicates grouping of data. For example, in addition to performing L2P address translation operations, a flash translation layer (FTL) of the data storage device may be "re-used" by also indicating mapping traditionally indicated using a mapping table stored at a host device. As a result, usage of resources to maintain a mapping table at the accessing device to indicate grouping of data may be reduced. For example, certain garbage collection operations performed by a host device to delete or compact entries of the mapping table may be avoided.

Particular aspects of the present disclosure are described below with reference to the drawings. In the description, common features are designated by common reference numbers. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." Further, an operation performed "based on" a condition or event may also be performed based on one or more other conditions or events not explicitly recited. As used herein, "exemplary" may indicate an example, an implementation, and/or an aspect, and should not be construed as limiting or as indicating a preference or a preferred example, implementation, and/or aspect.

Referring to FIG. 1, an illustrative example of a system is depicted and generally designated 100. The system 100 includes a data storage device 102 and a device 180 (e.g., a host device or an accessing device).

The data storage device 102 includes a memory device 103 (e.g., one or more memory dies) and a controller, such as a memory controller 130. The memory controller 130 is coupled to the memory device 103. In some implementations, the data storage device 102 is integrated within (e.g., embedded within) the device 180, such as in connection with a solid-state drive (SSD) implementation.

The memory device 103 includes a non-volatile memory 104, such as a non-volatile array of storage elements included in one or more memory dies. The non-volatile memory 104 may include a flash memory (e.g., a NAND flash memory) or a resistive memory, such as a resistive random access memory (ReRAM), as illustrative examples. The non-volatile memory 104 may have a three-dimensional (3D) memory configuration. As used herein, a 3D memory device may include multiple physical levels of storage elements (instead of having a single physical level of storage elements, as in a planar memory device). As an example, the non-volatile memory 104 may have a 3D vertical bit line (VBL) configuration. In a particular implementation, the non-volatile memory 104 is a non-volatile memory having a 3D memory array configuration that is monolithically formed in one or more physical levels of arrays of memory cells having an active area disposed above a silicon substrate. Alternatively, the non-volatile memory 104 may have another configuration, such as a two-dimensional (2D) memory configuration or a non-monolithic 3D memory configuration (e.g., a stacked die 3D memory configuration).

The non-volatile memory 104 includes one or more regions of storage elements. An example of a storage region is a block, such as a NAND flash erase group of storage elements, or a group of resistance-based storage elements in a ReRAM implementation. Another example of a storage region is a word line of storage elements (e.g., a word line of NAND flash storage elements or a word line of resistance-based storage elements). A storage region may have a single-level-cell (SLC) configuration, a multi-level-cell (MLC) configuration, or a tri-level-cell (TLC) configuration, as illustrative examples. Each storage element of the non-volatile memory 104 may be programmable to a state (e.g., a threshold voltage in a flash configuration or a resistive state in a resistive memory configuration) that indicates one or more values. As an example, in an illustrative TLC scheme, a storage element is programmable to a state that indicates three values. As an additional example, in an illustrative MLC scheme, a storage element is programmable to a state that indicates two values.

The memory device 103 includes circuitry (e.g., read/write circuitry 116) to enable operation of the memory device 103, such as operation of one or more memory dies of the memory device 103. The read/write circuitry 116 may be a single component or may include separate components of the memory device 103, such as read circuitry and write circuitry.

The memory device 103 is coupled to the memory controller 130 via a communication path, such as a bus. For example, the communication path may include one or more channels to enable the memory controller 130 to communicate with a single memory die of the memory device 103. As another example, the communication path may include multiple distinct channels (e.g., multiple communication channels) to enable the memory controller 130 to communicate with each memory die of the memory device 103 in parallel with, and independently of, communication with other memory dies of the memory device 103.

The memory controller 130 includes a memory interface 132 configured to communicate with the memory device 103 and further includes an access device interface 136 configured to communicate with the device 180. The memory controller 130 further includes a volatile memory 146. The volatile memory 146 may be configured to store control information, such as a logical-to-physical (L2P) address mapping table 148. The memory controller 130 may further include a flash translation layer (FTL) 134. The FTL 134 may be configured to access the L2P address mapping table 148 and to modify the L2P address mapping table 148 (e.g., in response to write operations performed at the non-volatile memory 104). The memory controller 130 may optionally include a group write detection circuit 144.

The memory controller 130 is configured to receive data from the device 180 via the access device interface 136, such as in connection with a request for write access to the non-volatile memory 104. The memory controller 130 may be configured to encode the data to generate one or more error correcting code (ECC) codewords using one or more ECC encoding techniques. For example, the memory controller 130 may include a Reed-Solomon (RS) encoder, a Bose-Chaudhuri-Hocquenghem (BCH) encoder, a low-density parity-check (LDPC) encoder, an encoder configured to encode data according to one or more other ECC techniques, or a combination thereof.

The memory controller 130 is configured to send data to the memory device 103 (e.g., via the memory interface 132). The memory device 103 is configured to store the data to the non-volatile memory 104.

The memory controller 130 is configured to access data from the non-volatile memory 104. As an illustrative example, the memory controller 130 may receive a request for read access to the data. The memory controller 130 may send a read command to the memory device 103 to initiate reading of the data. In response to the read command, the memory device 103 may sense the data using the read/write circuitry 116 to generate sensed data. Depending on the particular implementation, the sensed data may include a set of hard bits representing the data, a set of soft bits representing the data, or both. In some cases, the sensed data may differ from the data due to one or more bit errors.

The memory device 103 may provide sensed data to the memory controller 130. The memory controller 130 is configured to receive the sensed data from the memory device 103 (e.g., via the memory interface 132). The memory controller 130 may be configured to decode data read from the non-volatile memory 104 to detect and correct, up to an error correction capability of the ECC scheme, one or more bit errors that may be present in the data. The memory controller 130 may include an RS decoder, a BCH decoder, an LDPC decoder, a decoder configured to decode data according to one or more other ECC techniques, or a combination thereof. The memory controller 130 may be configured to provide decoded data to the device 180.

The memory controller 130 further includes one or more processors, such as a processor 142. In an illustrative example, the processor 142 corresponds to a central processing unit (CPU) of the memory controller 130. The processor 142 is configured to control operations of the data storage device 102, such as by controlling read operations to the non-volatile memory 104, write operations to the non-volatile memory 104, other operations, or a combination thereof. The processor 142 is configured to execute instructions that may be received from the non-volatile memory 104 or from a memory included in the memory controller 130, such as a read-only memory (ROM), as illustrative examples.

The device 180 includes an interface 182 to the data storage device 102. The device 180 further includes a data aggregation controller 188 and a buffer 184 (e.g., a storage area) coupled to the interface 182 and to the data aggregation controller 188. FIG. 1 also illustrates that the device 180 includes one or more processors, such as a processor 186.

During operation, the buffer 184 is configured to store data 174. For example, the processor 186 may execute instructions 183 of a program that generates the data 174 and that indicates the data 174 is to be written to the non-volatile memory 104. In response executing the instructions 183, the device 180 may store the data 174 to the buffer 184. In some examples, the portions of the data 174 are written to the buffer 184 serially (e.g., the device 180 may "collect" or "aggregate" the data 174 at the buffer 184). For example, the data 174 may include pages corresponding to "random" write commands that are unrelated (e.g., that use non-sequential logical addresses).

The data aggregation controller 188 is configured to detect that a data size of the data 174 satisfies a threshold 189. To illustrate, the data size of the data 174 may correspond to a number of bytes of the data 174, and the threshold 189 may correspond to a threshold number of bytes.

In a particular example, the buffer 184 includes a plurality of storage regions 190. The plurality of storage regions 190 may include a particular storage region 192 storing the data 174, and the data aggregation controller 188 may be configured to detect that the data size of the data 174 satisfies the threshold 189 based on a storage condition of the particular storage region 192. For example, the storage condition may indicate that the particular storage region 192 is full. In this example, the data aggregation controller 188 may be configured to detect that a data size of the data 174 satisfies the threshold 189 based the particular storage region 192 being "full" of data.

In response to detecting that the data size of the data 174 satisfies the threshold 189, the data aggregation controller 188 may cause the buffer 184 to output the data 174. For example, the data aggregation controller 188 may provide a signal (e.g., an enable signal) indicating the particular storage region 192. The signal may also include an opcode indicating that the data 174 is to be output from the particular storage region 192 to the interface 182 for storage at the non-volatile memory 104. In some examples, the data aggregation controller 188 may update control information to indicate that the data 174 is ready for deletion (e.g., that the data 174 is invalid or "stale") in response to outputting of the data 174 by the buffer 184 to the interface 182.

The interface 182 is configured to provide the data 174 to the data storage device 102 using a single command in response to the data size of the data 174 satisfying the threshold 189. For example, the device 180 may provide a command 170 (e.g., a vendor-specific command) to the data storage device 102 using the interface 182.

The device 180 is configured to access the data 174 from the buffer 184, from the data storage device 102, or both. To illustrate, after sending the data 174 to the data storage device 102, the processor 186 may execute an instruction to access the data 174. In some cases, the data 174 may remain at the buffer 184 (e.g., prior to performance of a flush operation to delete the data 174). As a result, the processor 186 may be configured to check the buffer 184 to determine whether the buffer 184 stores the data 174 (or whether the data 174 has been deleted via a flush operation). To further illustrate, data stored at the buffer 184 may be indexed by logical addresses, and the processor 186 may access the buffer 184 using the multiple logical addresses 176 to determine whether the data 174 is at the buffer 184. If the processor 186 fails to identify the data 174 at the buffer 184, the processor 186 may send one or more requests to the data storage device 102 for read access to the data 174. In some implementations, the data aggregation controller 188 is configured to use a binary search tree (BST) or one or more other indexing structures to determine whether data is stored at the buffer 184. An indexing structure may indicate a mapping between logical block numbers used by the processor 186 to a corresponding storage region of the plurality of storage regions 190 that stores data associated with a particular logical block number.

The command 170 includes the data 174. The command 170 also indicates multiple logical addresses 176 associated with the data 174 and a number of write operations 178 associated with the command 170. The command 170 may further indicate an opcode 172 (e.g., a group write serialization (WS) opcode, also referred to herein as a WS group write opcode).

In some implementations, the data aggregation controller 188 is configured to initiate a flush operation to delete the data 174 from the particular storage region 192 in response to providing the data 174 to the data storage device 102. The flush operation may "clear" the data 174 from the particular storage region 192 to enable additional data to be stored to the particular storage region 192. In an illustrative example, the data aggregation controller 188 is configured to notify the processor 186 of the flush operation (e.g., to enable the processor 186 to write additional data to the particular storage region 192 during execution of the instructions 183). The data aggregation controller 188 may be configured to maintain a list indicating which of the plurality of storage regions 190 are available to store data or are ready to be flushed. The list may also indicate which of the plurality of storage regions 190 is currently being used to store data.

The memory controller 130 is configured to receive the command 170 from the device 180. In a particular example, the FTL 134 is configured to determine one or more physical addresses of the non-volatile memory 104 based on the multiple logical addresses 176 and the opcode 172. For example, based on the opcode 172, the FTL 134 may determine that pages of the data 174 are to be written serially to the non-volatile memory 104 (e.g., instead of writing the pages using random write operations). The FTL 134 may be configured to determine a physical address 138 of the non-volatile memory 104 corresponding to a storage region that is to store the data 174. The FTL 134 may determine the physical address 138 (or an offset from the physical address 138) for each logical address of the multiple logical addresses 176 to enable the FTL 134 to retrieve specific data associated with each of the multiple logical addresses 176. A logical-to-physical mapping for each of the multiple logical addresses 176 is stored in the L2P address mapping table 148, enabling the device 180 to avoid storing and maintaining another table indicating mapping information.

The memory controller 130 may be configured to perform a write operation to store the data 174 to the non-volatile memory 104 in response to the command 170. The memory controller 130 may be configured to update multiple entries of the L2P address mapping table 148 in response to the write operation. For example, the FTL 134 may be configured to update entries of the L2P address mapping table 148 to indicate that the multiple logical addresses 176 are associated with the physical address 138. Each entry of the L2P address mapping table 148 may indicate a mapping of a logical address to a physical address of the non-volatile memory 104.

In some implementations, the opcode 172 may be omitted from the command 170. For example, in some implementations, the multiple logical addresses 176 may include a value that is selected to indicate that the command 170 is a WS group write command (e.g., to distinguish the command 170 from another command, such as an "individual" write command) To illustrate, the multiple logical addresses 176 may include an "invalid" logical address (e.g., a logical address that is outside of a range of valid logical addresses) or may include a logical address that is reserved for WS group write commands.

In some implementations, the group write detection circuit 144 is configured to detect WS group write commands (e.g., the command 170), such as based on the opcode 172 or based on the multiple logical addresses 176. The group write detection circuit 144 may be configured to distinguish a WS group write command (e.g., the command 170) from one or more other commands, such as a second command that corresponds to an "individual" (e.g., non-aggregated) command indicating a single write operation and a single logical address. In some cases, the group write detection circuit 144 includes a comparator circuit configured to compare opcodes (or other information, such as logical addresses) of commands received at the data storage device 102 to detect WS group write commands (e.g., the command 170).

Accordingly, the device 180 may be configured to perform a write serialization (WS) aggregation process to aggregate commands, such as random commands (e.g., to non-sequential logical addresses) having relatively small data payloads, into a single command (e.g., the command 170). In some cases, the device 180 may exclude non-random write operations (e.g., sequential write operations) and large write operations (e.g., write operations having data that satisfies a particular data threshold) from the WS aggregation process. For example, non-random write operations and large write operations may be initiated by the device 180 using the second command (instead of aggregating the commands using the buffer 184). In a particular implementation, the data aggregation controller 188 is configured to detect whether commands should be aggregated based on one or more of a data size associated with the commands and whether the commands are associated with sequential or random logical addresses.

One or more aspects described with reference to FIG. 1 may reduce complexity and resource usage associated with a WS technique. For example, by using the command 170, the device 180 may avoid maintaining a mapping table that indicates grouping of data. As a result, usage of resources to maintain a mapping table at the device 180 to indicate grouping of data stored at the non-volatile memory 104 may be reduced.

Figure 2:
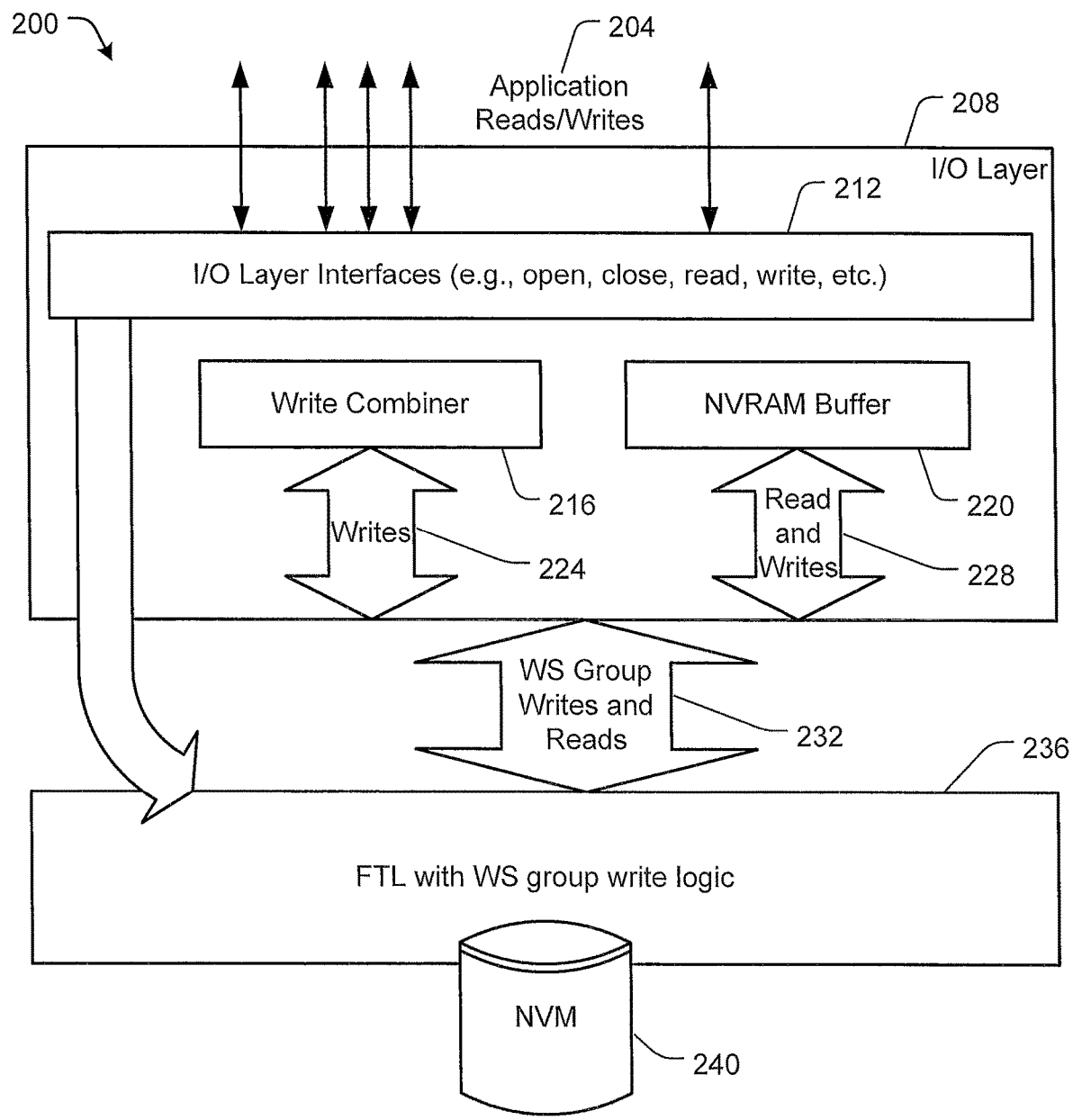
FIG. 2 is a block diagram depicting particular illustrative aspects of an example of the data storage device of FIG. 1.

FIG. 2 illustrates certain aspects of an illustrative example of a system 200. Components of the system 200 may be integrated within the system 100 of FIG. 1. In the example of FIG. 2, the system 200 includes an input output (I/O) layer 208, an FTL 236, and a non-volatile memory (NVM) 240.

FIG. 2 illustrates that the I/O layer 208 may receive application reads and writes 204 (e.g., from the processor 186 of FIG. 1). In a particular illustrative example, the I/O layer 208 corresponds to an I/O domain of the device 180. The I/O domain may include the interface 182, the buffer 184, and the data aggregation controller 188.

The I/O layer 208 may include I/O layer interfaces 212. In some implementations, the I/O layer interfaces 212 include multiple interfaces corresponding to respective operations (e.g., multiple ports), such as read and write operations. The I/O layer interfaces 212 may include the interface 182. In some examples, the interface 182 corresponds to a write interface of the I/O layer interfaces 212.

The I/O layer 208 includes a write combiner 216 and a non-volatile random access memory (NVRAM) buffer 220. In a particular example, the write combiner 216 corresponds to the data aggregation controller 188, and the NVRAM buffer 220 corresponds to the buffer 184. In some implementations, the write combiner 216 is configured to send write commands 224 to the data storage device 102, and the NVRAM buffer 220 is configured to send read commands and write commands 228 to the data storage device 102. The I/O layer 208 may provide WS group write operations and read operations 232 to the FTL 236 (e.g., the FTL 134).

The FTL 236 may include group write logic configured to perform a group write operation to write data (e.g., the data 174) to the NVM 240. The NVM 240 may correspond to the non-volatile memory 104. The NVM 240 may include a solid state drive (SSD), another non-volatile memory device, or a combination thereof.

One or more aspects described with reference to FIG. 2 may reduce complexity and resource usage associated with a WS technique. For example, the I/O layer 208 may avoid maintaining a mapping table that indicates grouping of data. As a result, usage of resources to maintain a mapping table at the device 180 to indicate grouping of data that is stored at the non-volatile memory 104 may be reduced.

Figure 3:
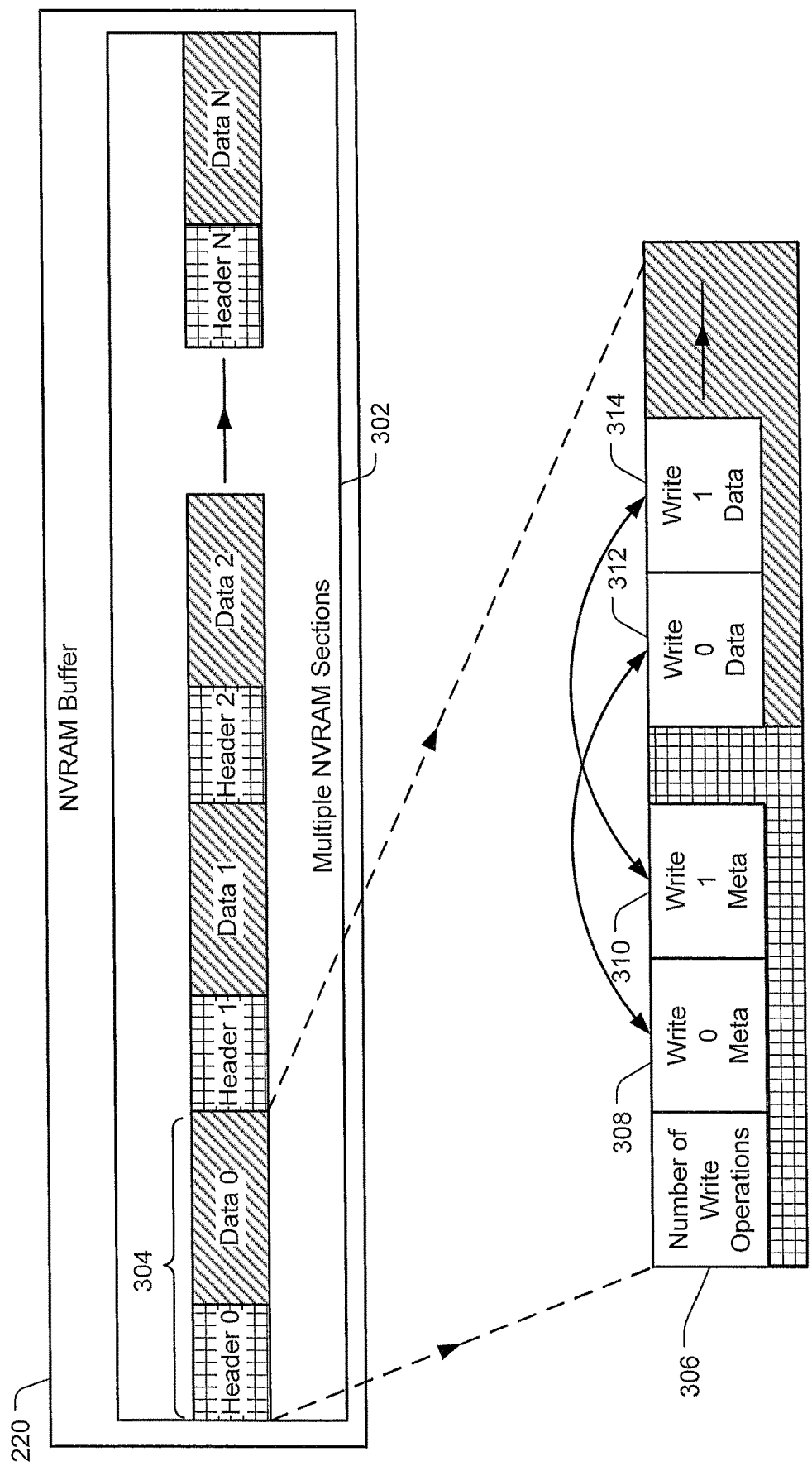
FIG. 3 is another block diagram depicting particular illustrative aspects of an example of the data storage device of FIG. 1.

FIG. 3 illustrates certain aspects of an example of the NVRAM buffer 220 of FIG. 2. The NVRAM buffer 220 includes multiple NVRAM sections 302. For example, the multiple NVRAM sections may correspond to the plurality of storage regions 190 of FIG. 1. Each section of the multiple NVRAM sections 302 is configured to store data and a header associated with the data. For example, a particular section (e.g., section 0) of the multiple NVRAM sections 302 may store representative data 304. In an illustrative example, the data 304 corresponds to the data 174 of FIG. 1. The data 304 may include a header portion (e.g., header 0) and data (e.g., data 0). Another section (e.g., section 1) of the multiple NVRAM sections 302 may store data 1 and header 1, and another section (e.g., section N) of the multiple NVRAM sections 302 may store data N and header N (where N is a positive integer greater than two).

In FIG. 3, the header portion of the data 304 indicates a number of write operations 306 (e.g., the number of write operations 178 of FIG. 1). To illustrate, in the example of FIG. 3, the number of write operations 306 may correspond to two write operations. In other examples, the number of write operations 306 may correspond to another number of write operations.

The header portion of the data 304 may further include metadata for each write operation indicated by the data 304. To illustrate, in the example of FIG. 3, the data 304 indicates metadata 308 for a first write operation (write 0) and further indicates metadata 310 for a second write operation (write 1). The data 304 further includes data 312 associated with the first write operation and data 314 associated with the second write operation. In a particular illustrative example, the metadata 308 indicates a data length of the data 312, one or more logical addresses associated with the data 312, a group identification (ID) associated with the data 304, other information, or a combination thereof.

In a particular example, data may be aggregated at a particular section of the NVRAM buffer 220 until a data size of the data satisfies a threshold (e.g., the threshold 189). In response to the data size satisfying the threshold, the data may be provided to the data storage device 102, and the data may be invalidated, erased, or overwritten.

Aspects of FIGS. 1-3 provide benefits as compared to systems that implement WS using mapping tables at a host device. To illustrate certain examples of the disclosure, certain memory drives may receive a series of small writes transferred as a group in a single request from a host device that uses a mapping table for serialized data. Grouping commands may reduce per-command overhead of an interface protocol over multiple requests. Grouping commands may also simplify drive implementation, such as enabling writing of data for multiple small writes as a single large write into an open block. Software applications may use this characteristic by serializing multiple small writes into larger writes ("write serialization"). In some cases, write serialization is complicated because software maintains a crash-safe host-based mapping table to remap block locations as they are serialized.

Write serialization may be an I/O layer on the host side that sits between drive(s) and application(s). The write serialization layer may batch small random writes and send the batched writes to a drive in large, commonly sized units. The write serialization layer may enable conversion of small random writes to bigger writes, thereby increasing drive endurance. The write serialization layer may also reduce command traffic between the host and the drive, which increases overall throughput, and may provide control to the host to manage multiple drives together in a storage array use case.

Write serialization using a host-side logical block to physical block number mapping table may enable performing different small random writes as a big single write on a contiguous area on drive. This mapping table records the actual physical block number where each application visible logical block is written on the drive. This table may be referenced at each read and write by the application, so the complete table is maintained in dynamic random access memory (DRAM). To support crash recovery, the table is made crash safe and is written on disk for persistence.

The mapping table may be associated with a large DRAM memory size for storage. For example, a drive with a 4 k block size may use a 1 gigabyte (GB) DRAM for 1 terabyte (TB) storage. High DRAM usage increases overall cost of flash based storage solutions and other storage solutions. Further, additional I/O requests may be used to keep the table crash safe and consistent (e.g., by using I/O requests to back up the mapping table). In some cases, maintenance of the mapping table may incur one additional write of mapping table data for each write of user data performed to the drive. Further, if the mapping table cannot be maintained in DRAM, the mapping table may be stored in another memory, resulting in an additional read and write. Garbage collection may be performed by the host for the mapping table (in addition to garbage collection at the drive), resulting in additional read and write I/O requests. As a result, write serialization is unattractive in certain use cases, such as high capacity flash based solutions. For example, if each host may have 64 TB to 128 TB of storage, this may imply a DRAM of 64 GB to 128 GB on each host for write serialization. Additionally, CPU usage for write serialization is also significant due to mapping table logic and garbage collection. As such, the memory and CPU usage to implement write serialization makes it infeasible to use in certain use cases, such as high capacity storage systems.

A data storage device (e.g., the data storage device 102) in accordance with the present disclosure features certain benefits associated with write serialization without performance degradation associated with a software mapping table. The data storage device may receive a command (e.g., the command 170) to accept multiple "small" writes in a single request transaction. A host (e.g., the device 180) may be configured to aggregate multiple requests (e.g., using the buffer 184) at the host in a manner that preserves durability at the block layer. The host may include host driver logic to retrieve data for reads from the aggregation buffer in order to access the most recent version of the data.

To enable transparency at the operating system block device interface, persistence "guarantees" for acknowledged writes may be used. The buffer used by the host to accumulate groups of write operations (e.g., the buffer 184 used by the device 180) before sending the groups of write operations to the data storage device may verify that individual writes are durable before acknowledging completion. For example, the buffer may include non-volatile memory, such as a non-volatile dual in-line memory module (NVDIMM) or a peripheral component interconnect express (PCIe) non-volatile random access memory (NVRAM) card. Alternatively or in addition, batch commits may be used to accumulate writes in volatile memory over a configurable window of time. At the end of the window, collected writes may be sent to the data storage device as a group.

Accordingly, small random commands may be aggregated on a host side (e.g., by the device 180) to increase a number of input/output operations per second (IOPS) at a system, such as the system 100 of FIG. 1. Aggregating random commands at the host side may avoid large DRAM and CPU resource usage associated with certain write serialization techniques due to address mapping table and garbage collection at the host side. For example, aggregating random commands may reduce or eliminate usage of a mapping table by the device 180 and may reduce memory usage (e.g., DRAM usage) by the device 180.

In accordance with the disclosure, a host side write aggregation process may include gathering random small writes at an NVRAM buffer (e.g., the buffer 184) and sending multiple writes to the FTL 134 as a single command (e.g., the command 170), indirectly requesting a write operation to a single physical location of the non-volatile memory 104 and updating of the L2P address mapping table 148 accordingly. Thus, the FTL 134 may be "reused" via a vendor specific WS group write command (e.g., the command 170). The WS group write command may group random small writes into a single command. By avoiding use of a host-side address mapping table, host-side garbage collection may be avoided. In addition, a number of I/O requests used to keep the table persistent and crash safe may be reduced.

A WS group write command may include multiple write commands sent as a single command (e.g., the command 170) to the data storage device 102. The multiple write commands combined in single WS group write command may include write commands to different portions of a logical address space visible to an application executed by the processor 186. Each such write may be a single block write or a range of blocks. Each command may be associated with one or more writes from one or more of the plurality of storage regions 190. To further illustrate, Table 1 indicates certain aspects that may be associated with a non-limiting example of the command 170.

TABLE 1

| Field | Length | Description |
| --- | --- | --- |
| Block Size | 4 bytes | Size of blocks in this command |
| Number of Writes | 2 bytes | Number of independent writes where each writes has range of block to be written |
| Metadata | 6 bytes for block address and 2 bytes for number of blocks. Total size = number of groups * (6 + 2) bytes | Offset and length of each write |

TABLE 1-continued

| Field | Length | Description |
| --- | --- | --- |
| Data | Blocks size * total blocks in all writes | Contiguous buffer for data of all writes ordered in block boundary according to writes in the write's metadata section of this command |

The device 180 may be configured to provide the command 170 to the data storage device 102 using one or more techniques. In a particular technique, the command 170 may correspond to an "extension" of a particular interface protocol, such as a modification of a frame information structures (FIS) of a small computer system interface (SCSI) protocol, a serial attached SCSI (SAS) protocol, or a serial advanced technology attachment (SATA) protocol, as illustrative examples. In this case, an application programming interface (API) may be exposed as a library or as a special library function using an input/output control (IOCTL) command that may be used by one or more applications, such as a write serialization application. In this case, the data storage device 102 may be configured to use the group write detection circuit 144 to detect receipt of the command 170 (e.g., to detect the opcode 172). In another technique, the command 170 may be sent as a "payload" of a write command to a particular reserved address or logical block number to indicate a WS group write command. In this example, the group write detection circuit 144 may be omitted from the data storage device 102.

The FTL 134 may be configured to identify a number of logical blocks indicated by the command 170. The FTL 134 may be configured to identify physically contiguous free space of the non-volatile memory 104 for the logical blocks, to initiate writing of the data at the physical space, and to increment a value of a counter to indicate the number of blocks. For each write group, a number of blocks (e.g., a block range) may be identified, and the L2P address mapping table 148 may be updated. The data storage device 102 may send a message to the device 180 to indicate a status of execution of the command 170. For example, the message may indicate an "overall" status of execution of the command 170, a separate status of each write operation indicated by the command 170, or a combination thereof.

Figure 4:
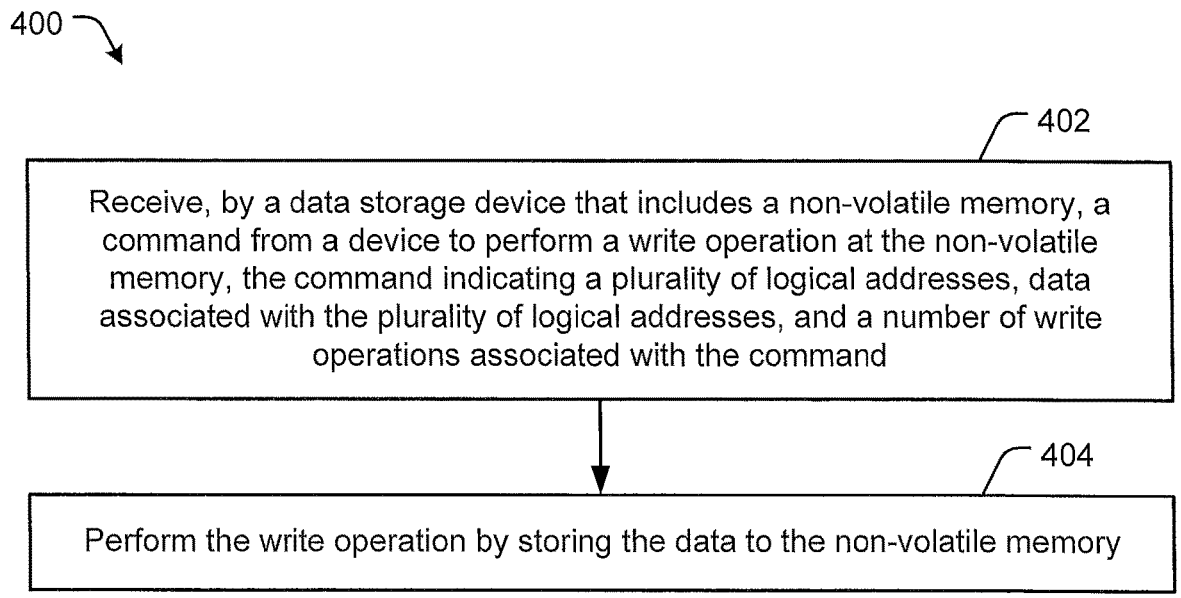
FIG. 4 is a flowchart of another particular illustrative example of a method of operation of a data storage device, such as by the data storage device of FIG. 1.

Referring to FIG. 4, an illustrative example of a method of operation of a data storage device is depicted and generally designated 400. For example, the method 400 may be performed by the data storage device 102 of FIG. 1.

The method 400 includes receiving, by a data storage device that includes a non-volatile memory, a command from a device to perform a write operation at the non-volatile memory, at 402. The command indicates a plurality of logical addresses, data associated with the plurality of logical addresses, and a number of write operations associated with the command. To illustrate, the data storage device 102 may receive the command 170 from the device 180 to perform a write operation at the non-volatile memory 104. The command 170 indicates the data 174, the multiple logical addresses 176, and the number of write operations 178.

The method 400 further includes performing the write operation by storing the data to the non-volatile memory, at 404. For example, the memory controller 130 may send the data 174 to the memory device 103, and the memory device 103 may write the data 174 to the non-volatile memory 104 using the read/write circuitry 116.

The method 400 may reduce complexity and resource usage associated with a WS technique. For example, a device may avoid maintaining a mapping table that indicates grouping of data. As a result, usage of resources to maintain a mapping table at the device to indicate grouping of data may be reduced.

Figure 5:
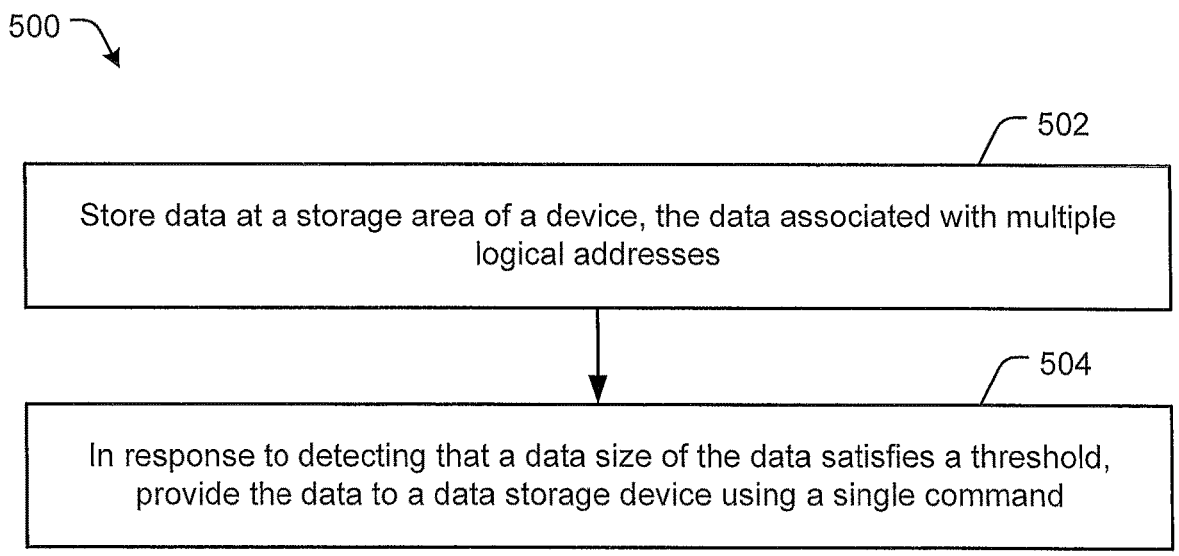
FIG. 5 is a flowchart of another particular illustrative example of a method of operation of an accessing device, such as the accessing device of FIG. 1.

Referring to FIG. 5, an illustrative example of a method of operation of a device is depicted and generally designated 500. For example, the method 500 may be performed by the device 180 of FIG. 1.

The method 500 includes storing data at a storage area of a device, at 502. The data is associated with multiple logical addresses. To illustrate, the device 180 may store the data 174 at the buffer 184. The data 174 is associated with the multiple logical addresses 176.

The method 500 further includes providing the data to a data storage device using a single command in response to detecting that a data size of the data satisfies a threshold, at 504. For example, the device 180 may provide the data 174 to the data storage device 102 using the command 170 in response to detecting that a data size of the data 174 satisfies the threshold 189.

The method 500 may reduce complexity and resource usage associated with a WS technique. For example, a device may avoid maintaining a mapping table that indicates grouping of data. As a result, usage of resources to maintain a mapping table at the device to indicate grouping of data may be reduced.

In conjunction with the described embodiments, an apparatus includes means (e.g., the buffer 184 or the NVRAM buffer 220) for storing data (e.g., the data 174 or the data 304) associated with multiple logical addresses (e.g., the multiple logical addresses 176). The apparatus further includes means (e.g., the data aggregation controller 188 or the write combiner 216) for detecting that a data size of the data satisfies a threshold (e.g., the threshold 189). The apparatus further includes means (e.g., the interface 182) for providing the data to a data storage device (e.g., the data storage device 102) using a single command (e.g., the command 170) in response to the data size satisfying the threshold. In some implementations, the apparatus further includes means (e.g., the processor 186) for executing instructions (e.g., the instructions 183).

Although various components depicted herein are illustrated as block components and described in general terms, such components may include one or more microprocessors, state machines, or other circuits configured to enable such components to perform one or more operations described herein. For example, certain aspects of the data aggregation controller 188 may represent physical components, such as hardware controllers, state machines, logic circuits, or other structures, to enable the device 180 aggregate commands into a group write command. As another example, certain aspects of the group write detection circuit 144 may represent physical components, such as hardware controllers, state machines, logic circuits, or other structures, to enable the data storage device 102 to detect a group write command.

Alternatively or in addition, certain aspects described herein may be implemented using a microprocessor or microcontroller. In a particular embodiment, one or more aspects of the group write detection circuit 144 are implemented using a processor (e.g., the processor 142) executing instructions (e.g., firmware), such as instructions that are stored at the non-volatile memory 104. Alternatively, or in addition, executable instructions that are executed by the processor may be stored at a separate memory location that is not part of the non-volatile memory 104, such as at a read-only memory (ROM) that may be included in the memory controller 130.

The data storage device 102 may be coupled to, attached to, or embedded within one or more accessing devices, such as within a housing of the device 180. For example, the data storage device 102 may be embedded within the device 180 in accordance with a Joint Electron Devices Engineering Council (JEDEC) Solid State Technology Association Universal Flash Storage (UFS) configuration. To further illustrate, the data storage device 102 may be integrated within an electronic device (e.g., the device 180), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the data storage device 102 is implemented in a portable device configured to be selectively coupled to one or more external devices, such as a host device. For example, the data storage device 102 may be removable from the device 180 (i.e., "removably" coupled to the device 180). As an example, the data storage device 102 may be removably coupled to the device 180 in accordance with a removable universal serial bus (USB) configuration.

The device 180 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The device 180 may communicate via a controller, which may enable the device 180 to communicate with the data storage device 102. The device 180 may operate in compliance with a JEDEC Solid State Technology Association industry specification, such as an embedded MultiMedia Card (eMMC) specification or a Universal Flash Storage (UFS) Host Controller Interface specification. The device 180 may operate in compliance with one or more other specifications, such as a Secure Digital (SD) Host Controller specification as an illustrative example. Alternatively, the device 180 may communicate with the data storage device 102 in accordance with another communication protocol. In some implementations, the data storage device 102 may be integrated within a network-accessible data storage system, such as an enterprise data system, an NAS system, or a cloud data storage system, as illustrative examples.

In some implementations, the data storage device 102 includes a solid state drive (SSD). The data storage device 102 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the data storage device 102 may be coupled to the device 180 via a network. For example, the network may include a data center storage system network, an enterprise storage system network, a storage area network, a cloud storage network, a local area network (LAN), a wide area network (WAN), the Internet, and/or another network.

To further illustrate, the data storage device 102 may be configured to be coupled to the device 180 as embedded memory, such as in connection with an embedded Multi-Media Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The non-volatile memory 104 may include a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. The non-volatile memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus comprising:
a non-volatile memory; and
a controller coupled to the non-volatile memory, the controller configured to:
receive a command from a host device to perform a write operation at the non-volatile memory, the command including:
a plurality of non-sequential logical addresses of a plurality of write operations aggregated in the command;
data associated with the plurality of non-sequential logical addresses of the plurality of write operations aggregated in the command;
a number to indicate how many aggregated random write operations are associated with the command and aggregated by the host device, wherein the number is two or more; and store the data associated with the plurality of non-sequential logical addresses in a physically contiguous area of the non-volatile memory.

2. The apparatus of claim 1, wherein:
the command further includes a write serialization (WS) group write opcode to indicate the data is to be written as a group; and
the controller is further configured to:
detect the WS group write opcode; and
in response, select the physically contiguous area of the non-volatile memory for storage of the data.

3. The apparatus of claim 2, further comprising a flash translation layer (FTL) of the controller, the FTL configured to determine a particular physical address of the non-volatile memory based on the plurality of logical addresses and the WS group write opcode.

4. The apparatus of claim 1, wherein the controller is further configured to:
perform the write operation to store the data to the non-volatile memory; and
update multiple entries of a logical-to-physical (L2P) address mapping table in response to the write operation.

5. The apparatus of claim 1 wherein the controller is configured to identify the command as a group write command from one or more addresses included in the plurality of non-sequential logical addresses.

6. The apparatus of claim 5 wherein the one or more addresses are invalid addresses or addresses reserved for group write commands.

7. The apparatus of claim 1 wherein the non-volatile memory is a monolithic three dimensional non-volatile memory including one or more memory device levels formed above a substrate.

8. The apparatus of claim 1 further comprising a host interface configured to communicate with the host device according to a communication protocol, wherein the communication protocol is one of Universal Serial Bus (USB) protocol, embedded MultiMedia Card (eMMC) protocol, Universal Flash Storage (UFS) protocol, or Secure Digital (SD) protocol.

9. The apparatus of claim 1 wherein the command corresponds to an extension of an interface protocol.

10. The apparatus of claim 1 wherein the command is a modification of a Frame Information Structure (FIS) of a Small Computer System Interface (SCSI) protocol, a Serial Attached SCSI (SAS) protocol, or a Serial Advanced Technology Attachment (SATA) protocol.

11. A method comprising:
receiving, by a data storage device that includes a non-volatile memory, a command from a host device to perform a write operation at the non-volatile memory, the command including:
a plurality of non-sequential logical addresses of a plurality of aggregated random write operations aggregated in the command;
data associated with the plurality of non-sequential logical addresses of the plurality of aggregated random write operations;
a write serialization (WS) group write opcode to indicate the data is to be written as a group; and
an indicator of the number of aggregated random write operations associated with the command, wherein the number is two or more, the random write operations are aggregated by the host device, and the random write operations are directed to the non-volatile memory;
detecting a WS group write from the WS group write opcode; and
in response to detecting the WS group write, executing the command by storing the data in a physically contiguous area of the non-volatile memory.

12. The method of claim 11, wherein the aggregated write operations are aggregated in the host device until the data satisfies a threshold.

13. The method of claim 12, further comprising determining, using a flash translation layer (FTL) of the data storage device, a particular physical address of the non-volatile memory based on the plurality of logical addresses and the WS group write opcode.

14. The method of claim 11, further comprising updating multiple entries of a logical-to-physical (L2P) address mapping table in response to the write operation.

15. An apparatus comprising:
a non-volatile memory; and
means for receiving a command from a host device to perform a write operation at the non-volatile memory, the command including:
a plurality of non-sequential logical addresses of a plurality of write operations aggregated in the command;
data associated with the plurality of non-sequential logical addresses of the plurality of write operations aggregated in the command;
a number to indicate how many aggregated random write operations are associated with the command and aggregated by the host device, wherein the number is two or more; and
a write serialization (WS) group write opcode to indicate the data is to be written as a group; and
wherein the means for receiving the command is configured to:
detect the WS group write opcode; and
in response to detection of the WS group write opcode:
store the data associated with the plurality of non-sequential logical addresses in a physically contiguous area of the non-volatile memory; and
update a logical-to-physical address mapping table with physical locations of the plurality of non-sequential logical addresses.

16. The apparatus of claim 15 wherein the means for receiving the command is further configured to send one or more messages to the host device to indicate a status of execution of the command.

17. The apparatus of claim 16 wherein the means for receiving the command is configured to send a message to indicate overall status of execution of the command.

18. The apparatus of claim 16 wherein the means for receiving the command is configured to send a message for each of the aggregated random write operations.

19. The apparatus of claim 15 wherein the non-volatile memory is a monolithic three dimensional non-volatile memory including one or more memory device levels formed above a substrate.

20. The apparatus of claim 15 wherein the non-volatile memory is a Resistive Random Access Memory (ReRAM).

* * * * *